(12) United States Patent
Fitzgerald et al.

(10) Patent No.: US 10,640,363 B2
(45) Date of Patent: May 5, 2020

(54) ACTIVE OPENING MEMS SWITCH DEVICE

(71) Applicant: Analog Devices Global, Hamilton (BM)

(72) Inventors: Padraig Fitzgerald, Mallow (IE); Michael James Twohig, Cork (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/422,508

(22) Filed: Feb. 2, 2017

(65) Prior Publication Data

US 2017/0225942 A1    Aug. 10, 2017

Related U.S. Application Data

(60) Provisional application No. 62/291,111, filed on Feb. 4, 2016.

(51) Int. Cl.
| | | |
|---|---|---|
| *H01H 59/00* | (2006.01) | |
| *B81B 3/00* | (2006.01) | |
| *B81C 1/00* | (2006.01) | |

(52) U.S. Cl.
CPC .......... *B81B 3/0051* (2013.01); *B81C 1/0015* (2013.01); *H01H 59/0009* (2013.01);
(Continued)

(58) Field of Classification Search
CPC ....... H01H 59/0009; H01H 2059/0054; H01H 1/20; H01H 2001/0047; H01H 1/0036;
(Continued)

(56) References Cited

U.S. PATENT DOCUMENTS

| | | |
|---|---|---|
| 688,235 A | 12/1901 | Craddock |
| 4,030,943 A | 6/1977 | Lee et al. |
| (Continued) | | |

FOREIGN PATENT DOCUMENTS

| | | |
|---|---|---|
| CN | 1575506 A | 2/2005 |
| CN | 101226856 A | 7/2008 |
| (Continued) | | |

OTHER PUBLICATIONS

International Search Reprot and Written Opinion dated May 22, 2017 for Application No. PCT/IB2017/000131.
(Continued)

*Primary Examiner* — Ahmed M Saeed
(74) *Attorney, Agent, or Firm* — Wolf, Greenfield & Sacks, P.C.

(57) ABSTRACT

Microelectromechanical systems (MEMS) switches are described. The MEMS switches can be actively opened and closed. The switch can include a beam coupled to an anchor on a substrate by one or more hinges. The beam, the hinges and the anchor may be made of the same material in some configurations. The switch can include electrodes, disposed on a surface of the substrate, for electrically controlling the orientation of the beam. The hinges may be thinner than the beam, resulting in the hinges being more flexible than the beam. In some configurations, the hinges are located within an opening in the beam. The hinges may extend in the same direction of the axis of rotation of the beam and/or in a direction perpendicular to the axis of rotation of the beam.

20 Claims, 10 Drawing Sheets

(52) U.S. Cl.
CPC . *B81B 2201/014* (2013.01); *B81B 2203/0118* (2013.01); *B81B 2203/0181* (2013.01); *B81C 2201/0109* (2013.01); *B81C 2201/0197* (2013.01); *H01H 2059/0027* (2013.01); *H01H 2059/0054* (2013.01)

(58) Field of Classification Search
CPC .. H01H 2059/0072; H01H 11/00; H01H 1/04; H01H 1/504; H01H 2001/0042; H01H 2001/0063; H01H 2001/0078; H01H 2001/0089; H01H 2061/006; H01H 61/04; H01H 2001/0052; H01H 2059/0036; H01H 49/00
USPC .......................... 200/181, 600, 61.45 R, 243
See application file for complete search history.

(56) References Cited

U.S. PATENT DOCUMENTS

| | | | |
|---|---|---|---|
| 6,046,659 | A | 4/2000 | Loo et al. |
| 6,115,231 | A | 9/2000 | Shirakawa |
| 6,153,839 | A | 11/2000 | Zavracky et al. |
| 6,377,438 | B1 | 4/2002 | Deane et al. |
| 6,384,353 | B1 | 5/2002 | Huang et al. |
| 6,635,506 | B2 | 10/2003 | Volant et al. |
| 6,657,759 | B2 | 12/2003 | Muller |
| 6,853,072 | B2 | 2/2005 | Asano et al. |
| 7,101,724 | B2 | 9/2006 | Chou |
| 7,106,066 | B2 | 9/2006 | Ivanciw et al. |
| 7,280,015 | B1 | 10/2007 | Schaffner et al. |
| 7,411,261 | B2 | 8/2008 | Lee et al. |
| 7,705,254 | B2 | 4/2010 | Kim et al. |
| 7,755,459 | B2 | 7/2010 | Nguyen et al. |
| 7,943,411 | B2 | 5/2011 | Martin et al. |
| 7,978,451 | B2 | 7/2011 | Mergens et al. |
| 8,570,122 | B1 | 10/2013 | Hammond |
| 9,583,294 | B2 | 2/2017 | Lee et al. |
| 9,748,048 | B2 | 8/2017 | Fitzgerald et al. |
| 2002/0018334 | A1 | 2/2002 | Hill et al. |
| 2003/0006868 | A1 | 1/2003 | Aigner et al. |
| 2004/0008097 | A1 | 1/2004 | Ma et al. |
| 2005/0099252 | A1 | 5/2005 | Isobe et al. |
| 2005/0184836 | A1 | 8/2005 | Chou |
| 2005/0225834 | A1* | 10/2005 | Regan ................ G02B 26/0833 359/291 |
| 2006/0044519 | A1* | 3/2006 | Huibers ............... G02B 26/008 353/30 |
| 2006/0086597 | A1 | 4/2006 | Lee et al. |
| 2006/0180409 | A1 | 8/2006 | Kweon et al. |
| 2008/0001691 | A1* | 1/2008 | Hong ..................... B81B 3/001 335/220 |
| 2009/0160584 | A1 | 6/2009 | Premerlani et al. |
| 2009/0321232 | A1 | 12/2009 | Naito et al. |
| 2010/0320606 | A1 | 12/2010 | Jain et al. |
| 2011/0147861 | A1 | 6/2011 | Steeneken et al. |
| 2011/0315526 | A1 | 12/2011 | Jahnes et al. |
| 2012/0313189 | A1 | 12/2012 | Huang et al. |
| 2013/0140155 | A1 | 6/2013 | Urvas et al. |
| 2015/0311003 | A1 | 10/2015 | Fitzgerald et al. |
| 2015/0311021 | A1 | 10/2015 | Lee et al. |
| 2018/0033565 | A1 | 2/2018 | Fitzgerald et al. |

FOREIGN PATENT DOCUMENTS

| | | |
|---|---|---|
| CN | 102394199 A | 3/2012 |
| DE | 41 13 190 C1 | 7/1992 |
| EP | 0 255 911 A2 | 2/1998 |
| EP | 1 672 662 A1 | 6/2006 |
| EP | 2 743 955 A1 | 6/2014 |
| JP | 2003-057572 A2 | 2/2003 |
| JP | 2003-522379 T2 | 7/2003 |
| JP | 2004-025431 A | 1/2004 |
| JP | 2005-536854 A | 12/2005 |
| JP | 2009-9884 A | 1/2009 |
| JP | 2009-152196 A | 7/2009 |
| JP | 2011-146403 A | 7/2011 |
| JP | 2013-041733 A | 2/2013 |
| JP | 2019-503057 T2 | 1/2019 |
| WO | WO 01/56920 A2 | 8/2001 |
| WO | WO 2008/033213 A2 | 3/2008 |
| WO | WO 2009/147600 A1 | 12/2009 |
| WO | WO 2013/024658 A1 | 2/2013 |

OTHER PUBLICATIONS

Extended European Search Report dated Jul. 13, 2016 in connection with Application No. 15164102.4-1808/3054469.
Japanese Office Action and English translation thereof dated Feb. 25, 2016 in connection with Japanese Application No. 2105-089553.
English translation of Japanese Office Action dated Dec. 22, 2016 in connection with Japanese Application No. 2015-089553.
Maciel et al., High-Reliability MEMS Switches for Wireless Applications. 2010 iMAPS New England—37th Symposium & Expo. Boxborough, MA. May 4, 2010;26 pages.
Extended European Search Report dated Jul. 13, 2016 in connection with European Application No. 15164102.4.
Japanese Notice of Reasons for Rejection and English translation thereof dated Feb. 25, 2016 in connection with Japanese Patent Application No. 2105-089553.
Japanese Notice of Reasons for Rejection and English translation thereof dated Dec. 22, 2016 in connection with Japanese Application No. 2015-089553.
Extended European Search Report dated Nov. 15, 2018 in connection with European Application No. 17153100.7.

* cited by examiner

ACTIVE OPENING MEMS SWITCH DEVICE

RELATED APPLICATIONS

This Application claims priority under 35 U.S.C. § 119(e) to U.S. Provisional Application Ser. No. 62/291,111, entitled "ACTIVE OPENING MEMS SWITCH DEVICE" filed on Feb. 4, 2016, which is hereby incorporated herein by reference in its entirety.

FIELD OF THE DISCLOSURE

The present application relates to microelectromechanical system (MEMS) switches.

BACKGROUND

Some conventional MEMS switches include cantilevered beams. The switch is closed when the free end of the beam is pulled into contact with an underlying substrate by application of an electric field generated by applying a voltage to an electrode on the substrate. When no voltage is applied to the electrode on the substrate, and therefore no electric field is generated, the spring restoring force of the beam causes the free end of the beam to not contact the substrate, such that the switch is open. Often the MEMS switch opens and closes a connection to a circuit coupled to the MEMS switch.

SUMMARY OF THE DISCLOSURE

In certain embodiments, an apparatus is provided, comprising a substrate; a post on the substrate; a microfabricated beam having an opening in a center portion thereof, the post being disposed within the opening; and a hinge mechanically coupling the microfabricated beam to the post. The apparatus is a microelectromechanical systems (MEMS) switch in some embodiments.

In certain embodiments, a method of fabricating a microelectromechanical systems (MEMS) switch is provided, comprising: fabricating a post on a substrate; fabricating a hinge coupled to the post; and fabricating a beam having an opening in a center portion thereof, the post being disposed within the opening and the beam being coupled to the post via the hinge.

In certain embodiments, an apparatus is provided, comprising: a substrate; a post on the substrate; a microfabricated beam having an opening in a center portion thereof, the post being disposed within the opening; and means for coupling the microfabricated beam to the post. The apparatus is a microelectromechanical systems (MEMS) switch in some embodiments.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
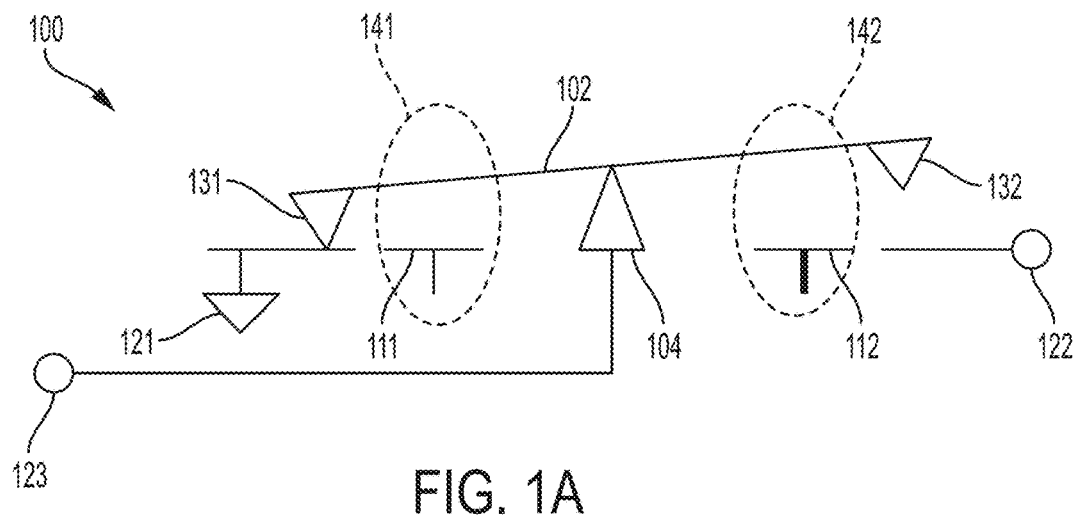
FIG. 1A illustrates schematically a teeter-totter switch operating in an open state, according to a non-limiting embodiment of the present application.

Aspects of the present application provide active microelectromechanical systems (MEMS) switches having a teeter-totter configuration, as well as methods of operating and fabricating such switches. The MEMS switch may include a relatively stiff beam connected to an underlying substrate by an anchor (e.g., a post) which may be centrally located with respect to the beam, and one or more hinges connecting the beam to the post. According to some aspects of the present application, the beam may be constructed to substantially resist bending during operation of the MEMS switch, while the hinge(s) may be constructed to allow for rotation of the beam about the post.

Applicant has appreciated that the lifetime of a MEMS switch can be increased by using a switch structure which does not rely upon the spring force of a bent beam to open the switch, but rather which is actively opened by application of a suitable control signal. Holding a cantilevered beam switch in a closed state for extended periods of time may degrade the restoring force of the beam, particularly when done at high temperatures, thus negatively impacting the beam's ability to disconnect from the substrate when the switch is opened and reducing the lifetime of the switch. According to one aspect of the present application, a "teeter-totter" MEMS switch is provided. The teeter-totter switch may alternatively be referred to herein as a "see-saw switch", a "rocking switch" or a "swinging switch". The teeter-totter MEMS switch may be configured to be actively closed and opened. The teeter-totter MEMS switch according to one or more aspects of the present application may, and in at least some situations does, exhibit longer lifetime than conventional cantilevered beam MEMS switches. Unlike cantilevered switches, the teeter-totter MEMS switch may comprise a stiff beam that is configured to tilt but not to bend.

Applicant has further appreciated that the robustness of a teeter-totter MEMS switch may be enhanced by using flexible hinges connected to the stiff beam and configured to enable the stiff beam to pivot about an anchor. According to an aspect of the present application, a teeter-totter MEMS switch includes a beam, hinges, and/or an anchor made of the same material. Having the beam and the hinges made of the same material may reduce mechanical stress experienced by the beam, thus enhancing the lifetime and/or the performance of the switch. However, in some embodiments, a teeter-totter switch having beams and hinges made of different materials may be provided, such that, for example, the anchor and hinges may be formed of a first material and the beam may be formed of a second material. According to one aspect of the present application, a teeter-totter switch comprising one or more hinges obtained from the same material as the (relatively stiff) beam is provided. The hinge(s) may be connected to an anchor, which in some embodiments may be centrally located with respect to the beam, and may exhibit a flexibility greater than the flexibility of the beam. For example, the hinge(s) may be designed to have a thickness that is less than the thickness of the beam, thus causing the hinge(s) to exhibit greater flexibility.

Applicant has further appreciated that teeter-totter MEMS switches of the type described herein may be efficiently fabricated by using a process flow that reduces or minimizes the number of sacrificial layers used. Reducing or minimizing the number of process steps needed for the fabrication of MEMS devices often translates into lower manufacturing cost and better lead time. According to one aspect of the present application, a teeter-totter MEMS switch of the type described herein may be fabricated by forming the beam, the anchor and the hinges through electroplating techniques, while using a small number of, or even avoiding entirely in some embodiments, the use of sacrificial layers.

The aspects and embodiments described above, as well as additional aspects and embodiments, are described further below. These aspects and/or embodiments may be used individually, all together, or in any combination of two or more, as the application is not limited in this respect.

As described above, aspects of the present application provide a teeter-totter MEMS switch having a relatively stiff beam, an anchor and relatively flexible hinges. The beam may be sufficiently stiff to avoid bending during typical operation of the switch, while the hinges may be sufficiently flexible to allow for hinging (e.g., torqueing) during typical operation of the switch. In some embodiments, the teeter-totter switch may be fabricated using MEMS fabrication techniques, with an example of a suitable fabrication technique being described further below. FIG. 1A illustrates schematically a teeter-totter switch, according to a non-limiting embodiment of the present application. Teeter-totter switch 100 may comprise a beam 102, an anchor 104, and electrodes 111, 112, 121, 122, 123, 131 and 132. In some embodiments, beam 102 may comprise a conductive material, such as gold, nickel or any other suitable conductive material. The material may be selected to provide a desired level of stiffness, for example to avoid bending when subjected to voltages of the magnitude typically experienced during operation of the MEMS switch. In some embodiments, the beam may comprise a single material. In other embodiments, the beam may comprise a laminate consisting of successively stacked materials. Beam 102 may be positioned to form one or more contacts with anchor 104, which may be disposed on a substrate (not shown in FIG. 1A). For example, anchor 104 may be disposed on a substrate of a silicon wafer. However, the application is not limited in this respect and any other suitable type of substrate can be used. In some embodiments, anchor 104 may be disposed on a layer of silicon dioxide, which may be positioned on the substrate. In some embodiments, beam 102 may be held solely by anchor 104, and may be suspended over the substrate. Electrodes 131 and 132 may be formed on either end of beam 102, for example being positioned near opposite edges of beam 102, with the remaining electrodes being on the substrate. Electrode 123 may be in electrical contact with anchor 104 and beam 102.

Figure 1B:
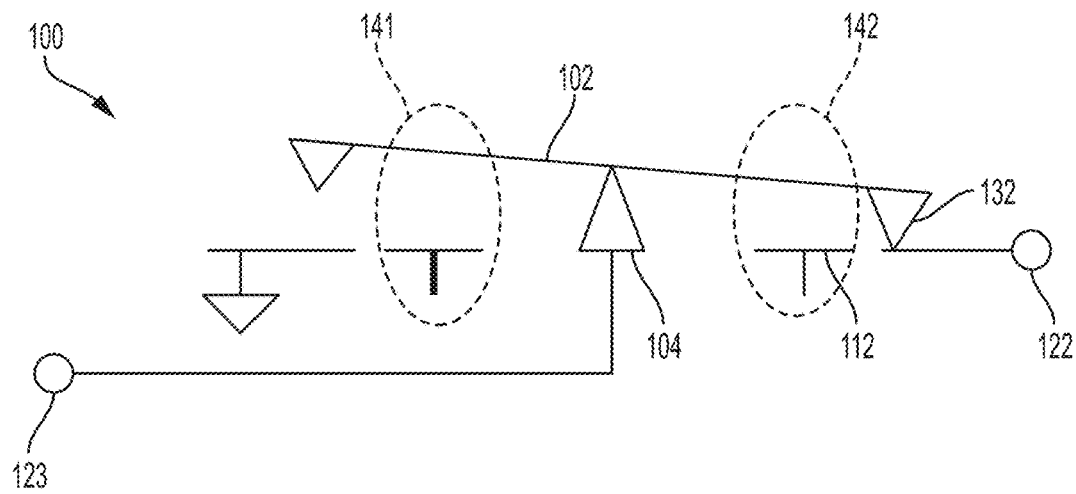
FIG. 1B illustrates schematically a teeter-totter switch operating in a closed state, according to a non-limiting embodiment of the present application.
Figure 1C:
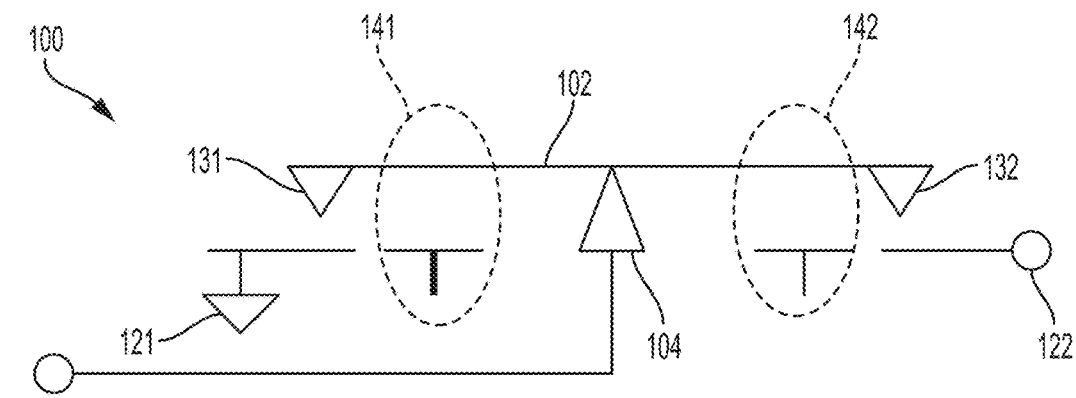
FIG. 1C illustrates schematically a teeter-totter switch operating in a neutral state, according to a non-limiting embodiment of the present application.

Teeter-totter switch 102 will be referred to herein as being in an "open state" when electrode 131 forms an electrical connection with electrode 121, as shown in FIG. 1A. In some embodiments, electrode 121 may be connected to a reference potential, such as an earth ground. Teeter-totter switch 102 will be referred to herein as being in a "closed state" when electrode 132 forms an electrical connection with electrode 122, as shown in FIG. 1B. In some embodiments, electrode 122 may be connected to a device and/or a circuit element. Due to the fact that beam 102 may comprise a conductive material, electrode 131 and electrode 132 may be biased at the same electrical potential in some embodiments. In other embodiments, there may be a voltage drop between electrode 131 and electrode 132 due to the finite conductivity of beam 102. Teeter-totter switch 102 will be referred to herein as being in an "neutral state" when electrode 131 does not form an electrical connection with electrode 121 and electrode 132 does not form an electrical connection with electrode 122, as shown in FIG. 1C.

In some embodiments, electrodes 111 and 112 may be used to control whether the teeter-totter MEMS switch is in an open, closed or neutral state. Electrode 111 may be configured to operate as a terminal of a back-capacitor 141. The second terminal of back-capacitor 141 may be formed by a portion of beam 102. Similarly, electrode 112 may be configured to operate as a terminal of a front-capacitor 142. The second terminal of front-capacitor 142 may be formed by a portion of beam 102. Beam 102 may be biased at a voltage, whether direct current (DC) or alternating current (AC), having an average value that is within a suitable range, such as, for example, between −0.1V and 0.1V in some embodiments, between −0.25V and 0.25V in some embodiments, between −0.5V and 0.5V in some embodiments, between −1V and 1V in some embodiments, between −2V and 2V in some embodiments, between −5V and 5V in some embodiments, between −10V and 10V in some embodiments, or between any values or range of values within such ranges. Other ranges are also possible. In some embodiments, beam 102 may be biased through an AC signal applied to electrode 123.

FIG. 1A illustrates schematically teeter-totter switch 100 operating in an open state, according to a non-limiting embodiment of the present application. In some embodiments, back-capacitor 141 may be used to force teeter-totter switch 100 to an open state. In some embodiments, electrode 111 may be biased with a voltage that causes beam 102 to experience an electrostatic attraction toward electrode 111. For example, electrode 111 may be biased at a voltage that is greater than 10V in some embodiments, greater than 25V in some embodiments, greater than 50V in some embodiments, greater than 75V in some embodiments, greater than 80V in some embodiments, greater than 100V in some embodiments, between 10V and 100V, or any voltage or range of voltages within such ranges suitable for pulling the beam 102 into contact with electrode 121. In response to applying such a voltage to bias electrode 111, beam 102 may tilt toward electrode 111 and, consequently, electrode 131 may form an electrical connection with electrode 121. In some embodiments, beam 102 may tilt by pivoting or hinging about anchor 104. In such a state, a signal applied to electrode 123 may not be able to reach the device and/or circuit element connected to electrode 122. In some embodiments, front-capacitor 142 may be biased with a voltage that is less than the voltage across the terminals of back-capacitor 141 in the open state. For example, front-capacitor 142 may be biased with a voltage having an average value equal to zero in the open state.

FIG. 1B illustrates schematically teeter-totter switch 100 operating in a closed state, according to a non-limiting embodiment of the present application. In some embodiments, front-capacitor 142 may be used to force teeter-totter switch 100 to a closed state. In some embodiments, electrode 112 may be biased with a voltage that causes beam 102 to experience an electrostatic attraction toward electrode 112. For example, electrode 112 may be biased at any of the voltage described previously in connection with biasing electrode 111. In response to biasing electrode 112, beam 102 may tilt toward electrode 112 and, consequently, electrode 132 may form an electrical connection with electrode 122. In some embodiments, beam 102 may tilt by pivoting or hinging about anchor 104.

In such a state, a signal applied to electrode 123 may propagate through anchor 104, beam 102, and electrode 132, thus reaching the device and/or circuit element connected to electrode 122. In some embodiments, back-capacitor 141 may be biased with a voltage that is less than the voltage across the terminals of front-capacitor 142 in the closed state. For example, back-capacitor 141 may be biased with a voltage having an average value equal to zero in the closed state.

FIG. 1C illustrates schematically teeter-totter switch 100 operating in a neutral state, according to a non-limiting embodiment of the present application. By biasing back-capacitor 141 and front-capacitor 142 with equal voltages, beam 102 may remain in a position of equilibrium on anchor 104, such that electrode 131 does not form an electrical connection with electrode 121 and electrode 132 does not form an electrical connection with electrode 122.

Figure 2:
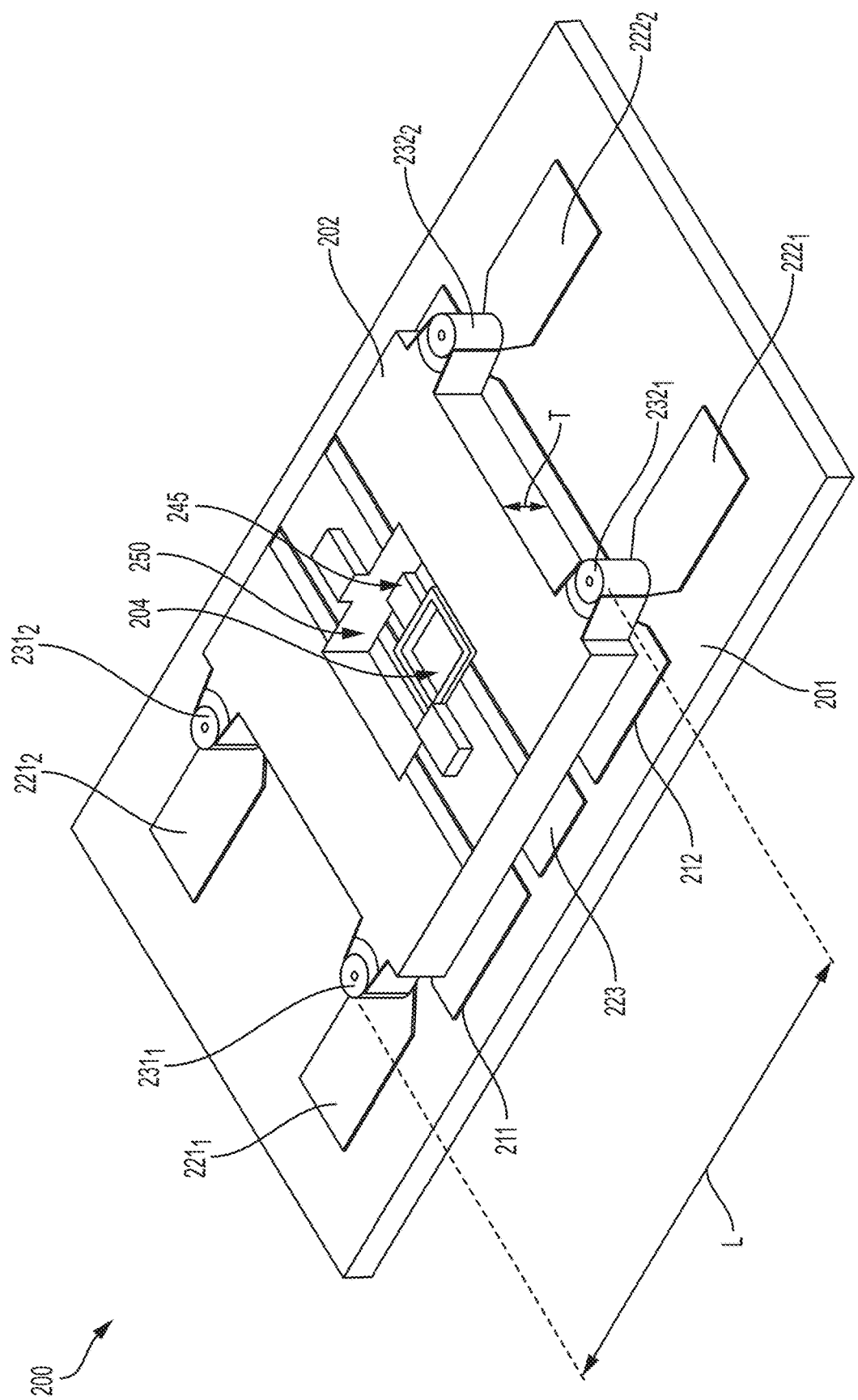
FIG. 2 is a perspective view of a teeter-totter switch, according to a non-limiting embodiment of the present application.

FIG. 2 is a perspective view of a MEMS teeter-totter switch having a beam coupled to an anchor by hinges, according to an embodiment of the present application. Teeter-totter switch 200 may serve as teeter-totter switch 100 of FIGS. 1A-1C. Teeter-totter switch 200 may be disposed on substrate 201 and comprise electrodes 211, 212 and 223 serving respectively as electrodes 111, 112 and 123 of teeter-totter switch 100. Teeter-totter switch 200 may comprise beam 202, serving as beam 102, and anchor 204, serving as anchor 104. In some embodiments, teeter-totter switch 200 may comprise one or more electrodes serving as electrode 131 and one or more electrodes serving as electrode 132. By way of example and not limitation, FIG. 2 illustrates teeter-totter switch 200 having two electrodes $231_1$ and $231_2$ serving as electrode 131, and two electrodes $232_1$ and $232_2$ serving as electrode 132. However the application is not limited in this respect and any other suitable number of electrodes may be used. Similarly, teeter-totter switch 200 may comprise one or more electrodes serving as electrode 121 and one or more electrodes serving as electrode 122. By way of example and not limitation, FIG. 2 illustrates teeter-totter switch 200 having two electrodes $221_1$ and $221_2$ serving as electrode 121, and two electrodes $222_1$ and $222_2$ serving as electrode 122. However the application is not limited in this respect and any other suitable number of electrodes may be used. In some embodiments, teeter-totter MEMS switches having more than one electrode on each end of the beam of the switch may provide robust electrical connections to the electrodes disposed on the substrate.

The material and dimensions of beam 202 may provide a desired degree of stiffness, such that beam 202 resists bending during operation (e.g., when an electric field is applied by electrode 211 and/or electrode 212). As illustrated in FIG. 2, beam 202 may have a thickness T and a length L. Length L may be defined as the length of the beam including electrodes $231_1$, $231_2$, $232_1$ and $232_2$. The beam may have a thickness that is between 4 µm and 30 µm in some embodiments, between 4 µm and 15 µm in some embodiments, between 6 µm and 16 µm in some embodiments, between 6 µm and 10 µm in some embodiments, between 10 µm and 14 µm in some embodiments, between 11 µm and 13 µm in some embodiments, or any value or range of values within such ranges. Other ranges are also possible.

The beam may have a length L that is between 25 µm and 300 µm in some embodiments, between 50 µm and 250 µm in some embodiments, between 75 pm and 200 µm in some embodiments, between 100 µm and 200 µm in some embodiments, between 125 µm and 175 µm in some embodiments, between 140 µm and 160 µm in some embodiments, between 75 µm and 125 µm in some embodiments, or any value or range of values within such ranges. Other ranges are also possible.

In some embodiments, beam 202 may have a ratio L/T with a value that is between 5:1 and 30:1 in some embodiments, between 7.5:1 and 20:1 in some embodiments, between 7.5:1 and 15:1 in some embodiments, between 10:1 and 15:1 in some embodiments, between 12:1 and 15:1 in some embodiments, between 10:1 and 13:1 in some embodiments, between 12:1 and 13:1 in some embodiments, or any other suitable value or range of values within such ranges. Other values are also possible.

As previously described, the beam may be made of gold or nickel, as non-limiting examples. Such materials with the dimensions described above may provide sufficient rigidity for the beam 202 to substantially avoid bending during operation of the MEMS teeter-totter switch 200. Any of the described materials may be used with any combination of the beam dimensions described above.

In some embodiments, beam 202 may have an opening 250 formed therein. Opening 250 may be entirely enclosed within beam 202 in some embodiments. Beam 202 may be suspended over the substrate 201, and may be connected to the substrate through anchor 204. Anchor 204 may have any suitable cross-sectional shape, such as square, circular, or rectangular, among other examples, where the cross-section is defined by a plane parallel to the plane of the beam 202 in the neutral position. The anchor 204 may be a post in some embodiments. Opening 250 may enclose the center of beam 202.

The beam 202 may be connected to anchor 204 through one or more hinges, such as hinge 245. In some embodiments, when a bias signal is applied to the front-capacitor, between electrode 212 and beam 202, an electrostatic force may attract beam 202 toward the front-capacitor. In response to such electrostatic attraction, the hinge(s) 245 may flex, thus facilitating the beam's rotation toward the front-capacitor, such that electrodes $232_1$ and $232_2$ may contact electrodes $222_1$ and $222_2$, respectively. Similarly, when a bias is applied to the back-capacitor, between electrode 211 and beam 202, an electrostatic force may attract beam 202 toward the back-capacitor in some embodiments. In response to such electrostatic attraction, the hinge(s) 245 may flex, thus facilitating the beam's rotation toward the back-capacitor such that electrodes $231_1$ and $231_2$ contact electrodes $221_1$ and $221_2$, respectively.

In some embodiments, the hinge(s) 245 may exhibit a flexibility that is greater than the flexibility of beam 202. In some embodiments, the hinge(s) may be formed with the same material as the beam, but have a thickness that is less than the thickness of the beam. For example, the hinge(s) may exhibit a thickness (in a direction parallel to the direction of thickness T of the beam) that is between 0.1 µm and 15 µm in some embodiments, between 0.5 µm and 10 µm in some embodiments, between 0.5 µm and 8 µm in some embodiments, between 1 µm and 5 µm in some embodiments, between 1 µm and 3 µm in some embodiments, or any suitable value or range of values within such ranges. Additionally or alternatively, the hinges may exhibit a thickness that is between 1% and 50% of the thickness of the beam in some embodiments, between 10% and 30% of the thickness of the beam in some embodiments, between 10% and 15% of the thickness of the beam in some embodiments, between 15% and 25% of the thickness of the beam in some embodiments, between 15% and 20% of the thickness of the beam in some embodiments, between 20% and 25% of the thickness of the beam in some embodiments, or any percentage or range of percentages within such ranges. Other ranges are also possible.

In some embodiments, the hinge(s), such as hinge 245, may be disposed between the anchor and the beam, extending in a direction that is parallel to the axis of rotation of the beam. In such a configuration, the hinges may be considered torsional hinges. In other embodiments, the hinge(s) may be disposed between the anchor and the beam, extending in a direction that is perpendicular to the axis of rotation of the beam and, in some embodiments, parallel to the length L of the beam. In at least some embodiments, the hinges may operate as cantilevered hinges.

Figure 3A:
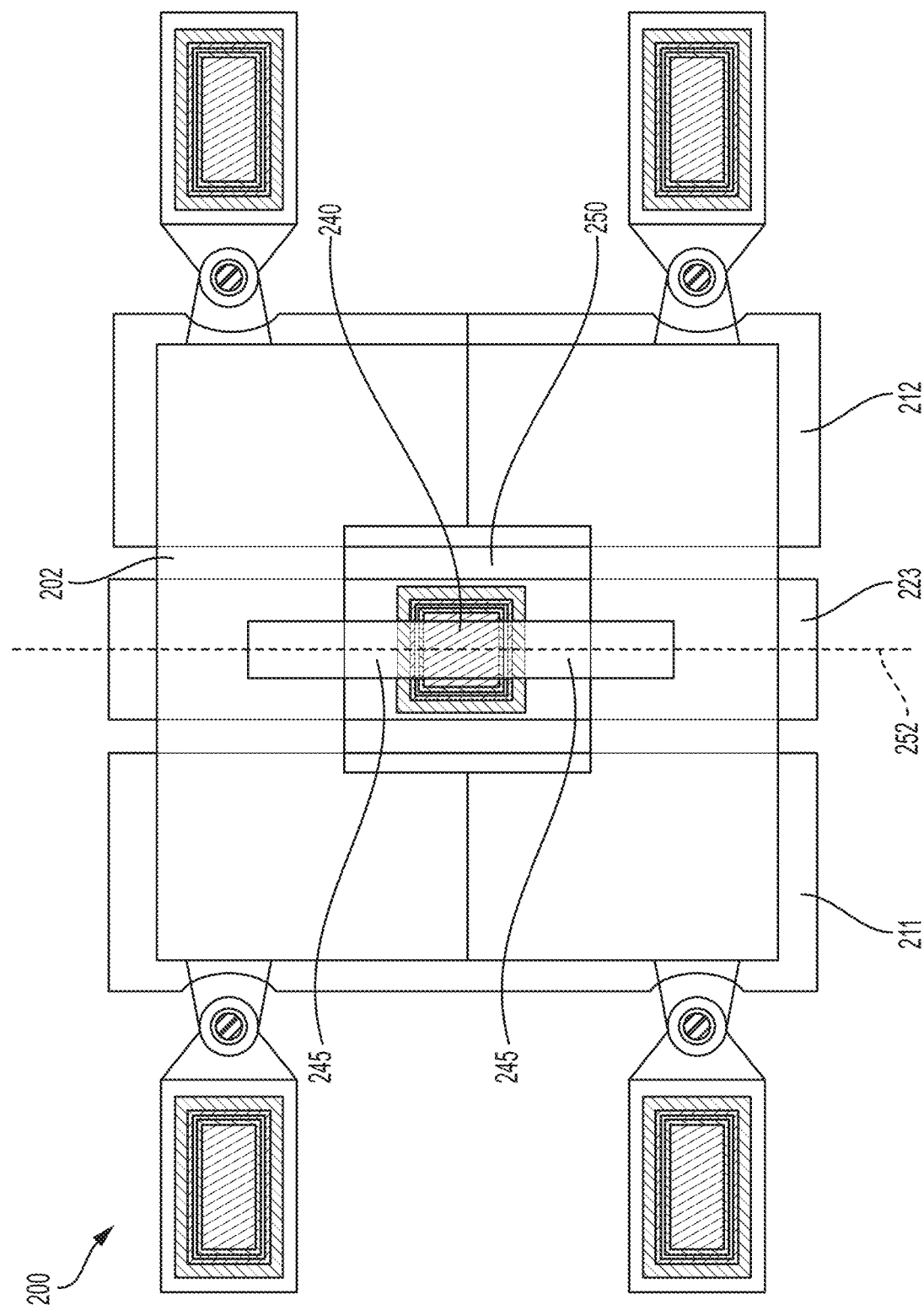
FIG. 3A is a top view of a teeter-totter switch comprising a plurality of hinges extending in the same direction of the axis of rotation of the switch beam, according to a non-limiting embodiment of the present application.

FIG. 3A is a top view of teeter-totter switch 200 comprising a plurality of hinges extending in the same direction as the axis of rotation of the beam, according to a non-limiting embodiment of the present application. FIG. 3A illustrates beam 202, opening 250, anchor 240, hinges 245 and electrode 223. In some embodiments, anchor 240 may be in electrical contact with electrode 223. FIG. 3A shows a teeter-totter switch having two hinges. However the application is not limited in this respect and any other suitable number of hinges may be used. Hinges 245 may be located, at least partially, within opening 250. In some embodiments, when a bias is applied to one of the capacitors, an electrostatic force may attract beam 202 toward such capacitor. In response to such electrostatic attraction, hinges 245 may experience a torque about the axis of the hinge, identified by a dashed line as axis 252, thus facilitating a rotation of the beam toward the capacitor. In some embodiments, as the hinges flex they may experience a stress that is greater than the stress experienced by the beam. In some embodiments, anchor 240 may remain still as hinges 245 flex. In some embodiments, the beam may entirely surround opening 250 to facilitate transfer of the force from one end of the beam to the other. For example, the force may be transferred from the end of the beam corresponding to electrode 131 to the end of the beam corresponding to electrode 132. The transfer of the force may be facilitated through the regions of the beam surrounding the opening. Alternatively or additionally, the ends of the beam may be connected through a region extending over the anchor, thus bridging the ends to one another.

Figure 3B:
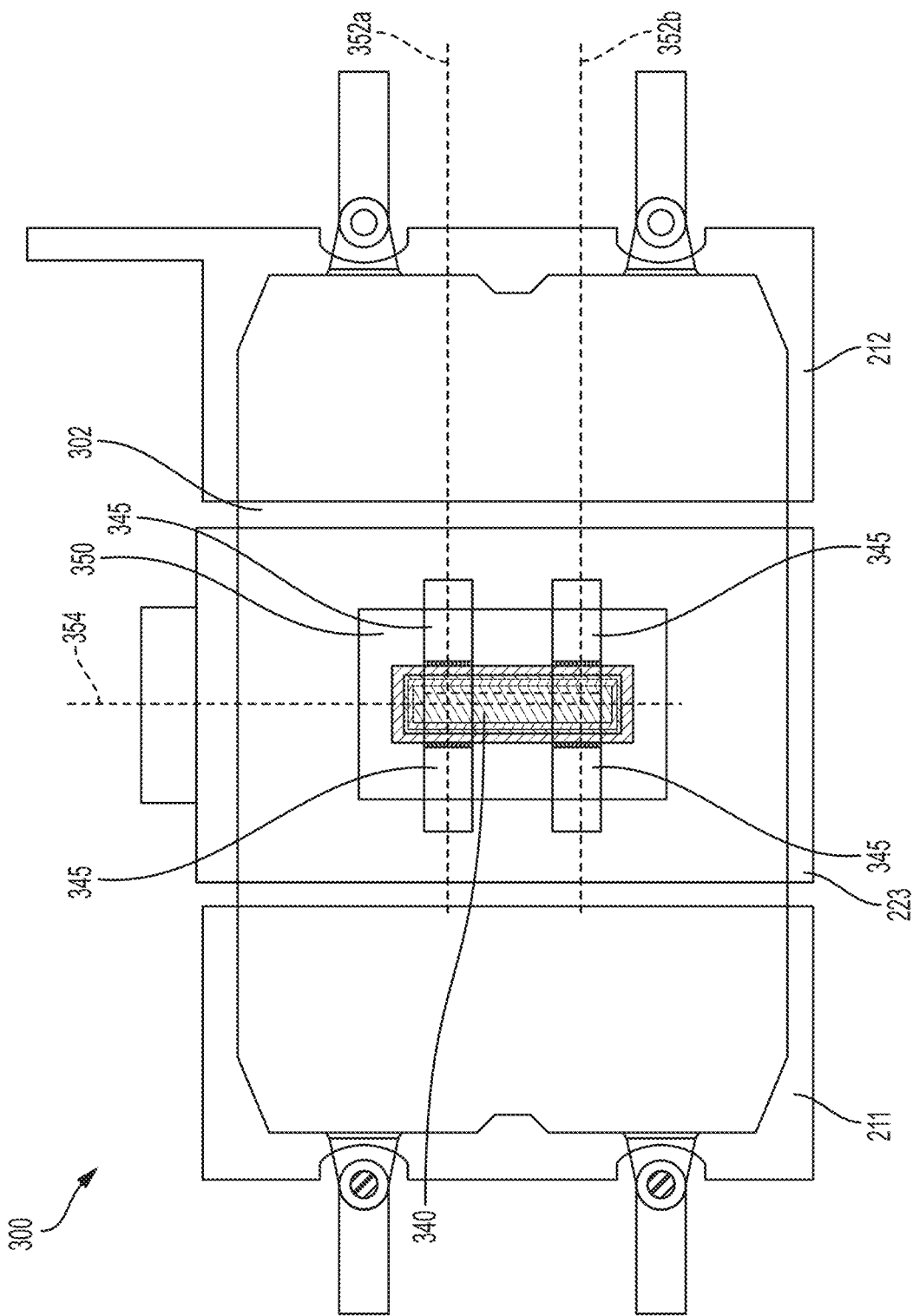
FIG. 3B is a top view of a teeter-totter switch comprising a plurality of hinges extending in a direction perpendicular to the axis of rotation of the switch beam, according to a non-limiting embodiment of the present application.

FIG. 3B is a top view of a MEMS teeter-totter switch 300 comprising a plurality of hinges extending in a direction perpendicular to the axis of rotation of the beam, according to a non-limiting embodiment of the present application. FIG. 3B illustrates beam 302, opening 350, anchor 340 and hinges 345. FIG. 3B shows a teeter-totter switch having four hinges, however the application is not limited in this respect as any other suitable number of hinges may be used. Hinges 345 may be located, at least partially, within opening 350. Similar to hinges 245, hinges 345 may exhibit a flexibility that is greater than the flexibility of beam 302. In some embodiments, the flexibility of the hinges 345 may be realized by the hinges having a thickness that is less than the thickness of the beam 302. In some embodiments, when a bias signal is applied to one of the capacitors (e.g., formed by beam 302 and electrode 211 or by beam 302 and electrode 212), an electrostatic force may attract beam 302 toward such capacitor. In response to such electrostatic attraction, hinges 345 may bend in a direction parallel to the axis of the hinges, shown by dashed lines as axes 352a and 352b, thus facilitating a rotation of the beam toward the capacitor about the perpendicularly situated axis of rotation of the beam 302, identified in dashed lining as axis 354. In some embodiments, as the hinges flex they may experience a stress that is greater than the stress experienced by the beam. In some embodiments, anchor 340 may remain still as hinges 345 flex. In some embodiments, the beam 302 may entirely surround opening 350 to facilitate transfer of the force from one end of the beam to the other. For example, the force may be transferred from the end of the beam corresponding to electrode 131 to the end of the beam corresponding to electrode 132. The transfer of the force may be facilitated through the regions of the beam surrounding the opening. Alternatively or additionally, the ends of the beam 302 may be connected through a region extending over the anchor, thus bridging the ends to one another.

Figure 3C:
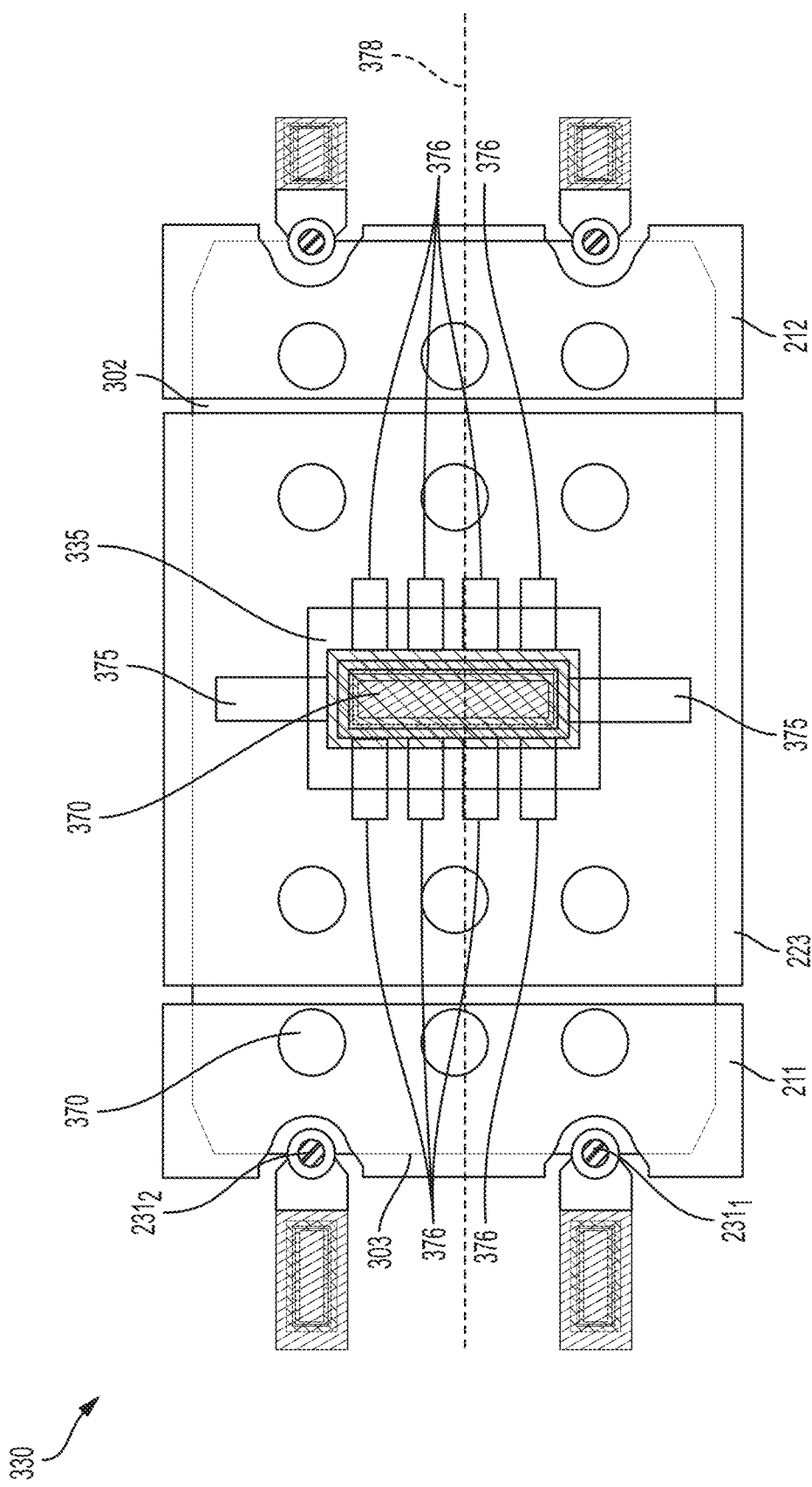
FIG. 3C is a top view of a teeter-totter switch comprising a first plurality of hinges extending in a direction perpendicular to the axis of rotation of the switch beam and a second plurality of hinges extending in the same direction of the axis of rotation of the switch beam, according to a non-limiting embodiment of the present application.

FIG. 3C is a top view of teeter-totter switch 330 comprising a first plurality of hinges extending in the same direction as the axis of rotation of the beam and a second plurality of hinges extending in a direction perpendicular to the axis of rotation of the beam, according to a non-limiting embodiment of the present application. FIG. 3C illustrates beam 302, opening 335, anchor 370, hinges 375 and 376, and electrodes 211, 212, and 223. FIG. 3C shows a teeter-totter switch having two hinges 375 and eight hinges 376. However the application is not limited in this respect and any other suitable number of hinges may be used. The hinges may be located, at least partially, within opening 335. In some embodiments, when a bias is applied to one of the capacitors, an electrostatic force may attract beam 302 toward such capacitor. In response to such electrostatic attraction, hinges 375 may experience a torque about the axis of the hinges, identified by a dashed line as axis 378, thus facilitating a rotation of the beam toward the capacitor. Additionally, hinges 376 may bend in a direction parallel to axis 378, thus further facilitating rotation of the beam. As in the embodiments illustrated in FIGS. 3A-3B, the beam may entirely surround opening 335 in some embodiments.

In some embodiments, beam 302 may comprise a plurality of apertures 370 formed therethrough. Any number of apertures may be provided and the apertures may be arranged in any suitable manner. For example, the apertures may be arranged to facilitate removal of the sacrificial layer, as discussed further below. Also, the apertures may have any suitable shape, as the illustrated circular aperture represent a non-limiting example. In some embodiments, the edge 303 of beam 302 may be in a plane passing through electrodes $231_1$ and $231_2$. For example, edge 303 may be in a plane passing through the center of the tips of electrodes $231_1$ and $231_2$. In this way, the force applied to the contacts may be increased. Additionally, or alternatively, this configuration may be used to decrease the capacitance associated with the tips of the contacts, thus enhancing radio-frequency (RF) isolation.

Figure 3D:
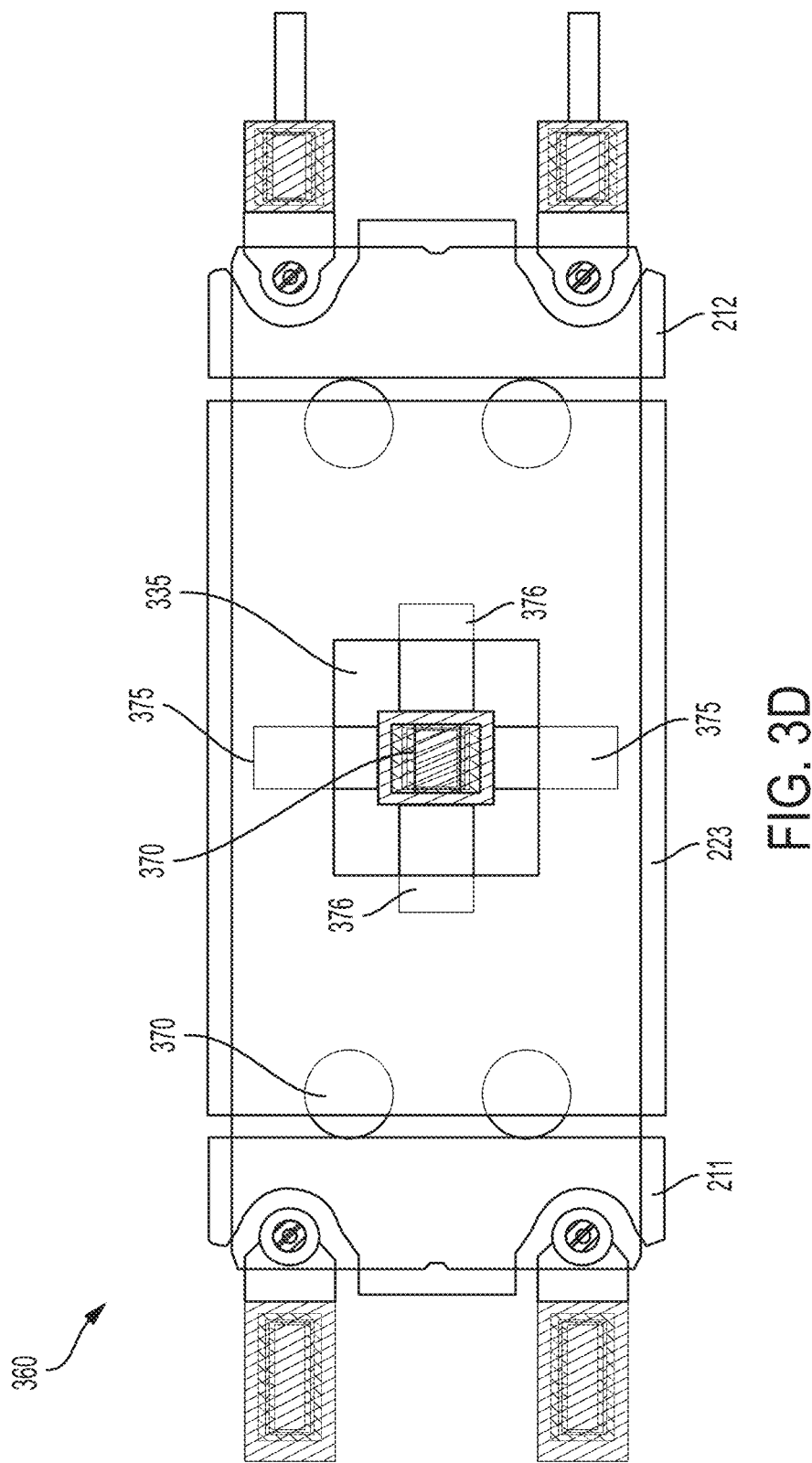
FIG. 3D is a top view of a teeter-totter switch comprising a pair of hinges extending in a direction perpendicular to the axis of rotation of the switch beam and a pair of hinges extending in the same direction of the axis of rotation of the switch beam, according to a non-limiting embodiment of the present application.

FIG. 3D is a top view of another teeter-totter switch 360, according to some non-limiting embodiments. As in the embodiment illustrated in FIG. 3C, teeter-totter switch 360 may comprise a first plurality of hinges extending in the same direction as the axis of rotation of the beam and a second plurality of hinges extending in a direction perpendicular to the axis of rotation of the beam. As illustrated, teeter-totter switch 360 may comprise a pair of hinges 375 extending in the same direction of the axis of rotation of the beam, and a pair of hinges 376 extending in a direction perpendicular to the axis of rotation of the beam.

Having two sets of hinges, one set of hinges being configured to torque and the other set being configured to bend, may be advantageous as it may allow designers to fit a larger number of hinges. As a result, the beams in the embodiments of FIGS. 3C-3D may exhibit an increased mobility in some embodiments.

Figure 4:
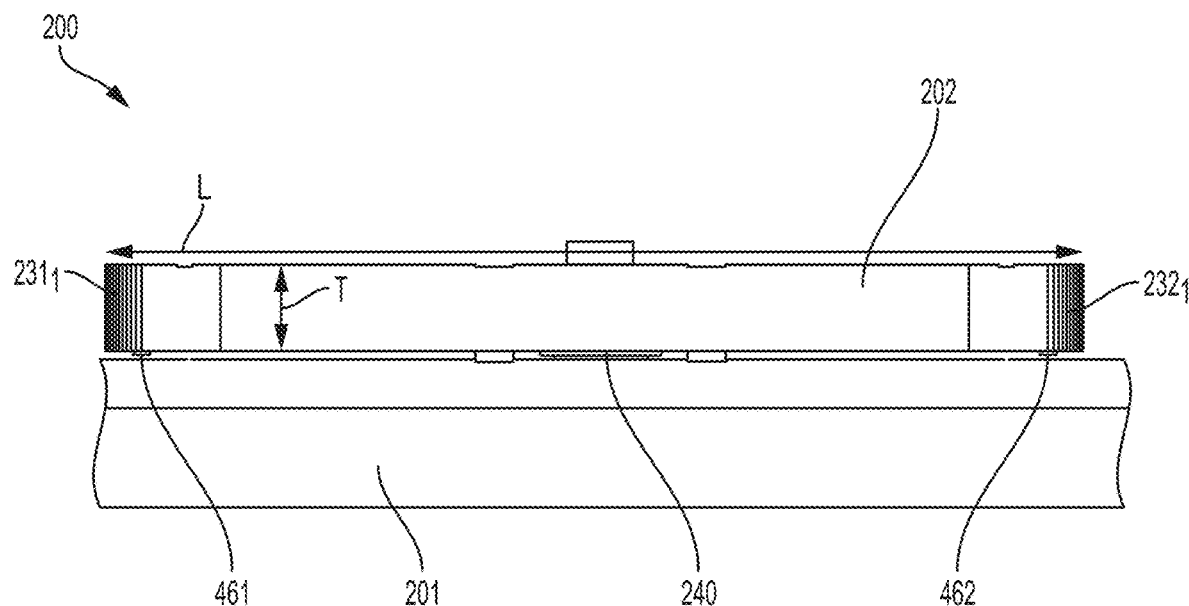
FIG. 4 is a side view of a teeter-totter switch, according to a non-limiting embodiment of the present application.

FIG. 4 is a side view of MEMS teeter-totter switch 200, according to a non-limiting embodiment of the present application. FIG. 4 illustrates beam 202, electrodes $231_1$ and $232_1$, anchor 240, and electrode tips 461 and 462. In some embodiments, electrode tips 461 and 462 may be disposed on a bottom surface of beam 202, in correspondence to electrodes $231_1$ and $232_1$, respectively. In some embodiments, electrode tips 461 and 462 may be configured to prevent electrodes $231_1$ and $232_1$ from sticking to the substrate 201. In some embodiments, electrode tips 461 and 462 may comprise a conductive material, such as gold, platinum, nickel, a platinum group metal, or any suitable material or combination of materials.

In some embodiments, beam 202 may be connected to anchor 240 through a plurality of hinges, as illustrated in FIGS. 3A-3B, and be suspended from the substrate 201. The distance between the beam and the substrate may be between 50 nm and 5 µm in some embodiments, between 100 nm and 1 µm in some embodiments, between 100 nm and 500 nm in some embodiments, between 200 nm and 400 nm in some embodiments, between 500 nm and 1 µm in some embodiments, between 600 nm and 800 nm in some embodiments, or any value or range of values within such ranges. Other values are also possible.

Although not illustrated in FIG. 4, the MEMS teeter-totter switch may be capped in some embodiments. The cap may provide a hermetic seal and may be formed of any suitable material. Such capping may also apply to the other embodiments described herein.

According to aspects of the present application, a process flow for the fabrication of MEMS teeter-totter switches of the types described herein is provided. In some embodiments, a MEMS teeter-totter switch may be fabricated by forming the beam, the anchor and the hinges through electroplating techniques, while reducing or minimizing the number of sacrificial layers used. The process flow described herein refers to a MEMS switch of the type illustrated in the embodiment of FIG. 3B. However, as a person of ordinary skill will readily appreciate, the process flow may be adapted to fabricate any embodiment of the present application. FIGS. 5A-5H collectively illustrate a process flow for the fabrication of MEMS teeter-totter switch 300, according to a non-limiting embodiment. The figures represent a cross section of MEMS teeter-totter switch 300 taken along axis 352b.

Figure 5A:
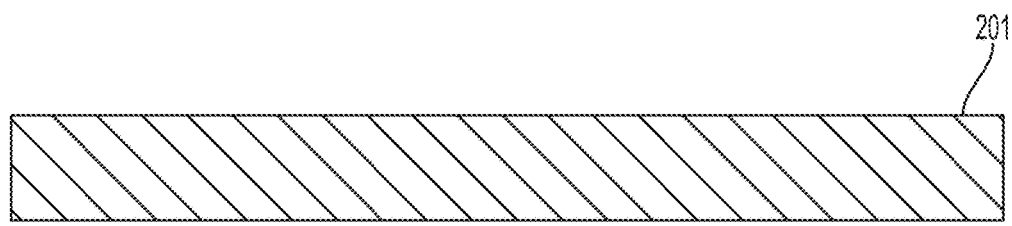
FIGS. 5A-5H illustrate a fabrication sequence for fabricating a MEMS teeter-totter switch of the types described herein, according to a non-limiting embodiment of the present application.

FIG. 5A illustrates a first step of the fabrication process. As shown, the process may begin with substrate 201. The substrate may comprise silicon, alumina, and/or silicon dioxide, or any other suitable material or combination of materials.

Figure 5B:
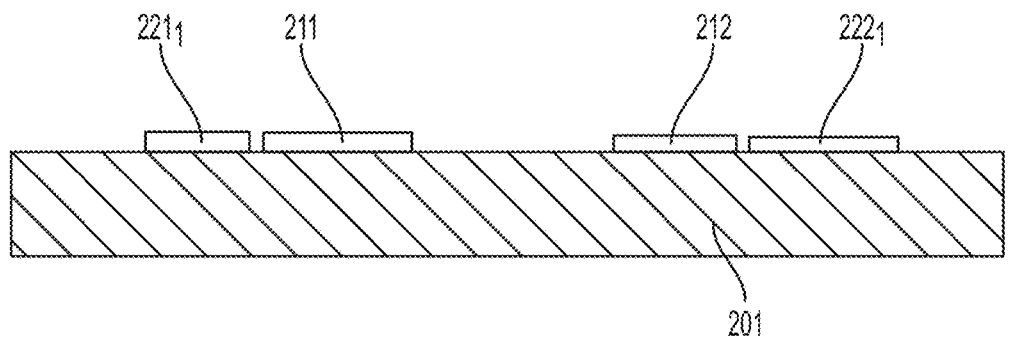

FIG. 5B illustrates a subsequent process step, according to a non-limiting embodiment of the present application. A plurality of electrodes may formed on the substrate 201. For example, electrodes 211, 212, $221_1$ and $222_1$ may be formed by depositing metal on substrate 201. In some embodiments, the metal may be deposited only on the desired regions. In other embodiments, metal may be deposited as a blanket, and the electrodes may be formed by etching the metal outside the desired regions. The thickness of the electrodes may be between 25 nm and 500 nm in some embodiments, between 50 nm and 2500 nm in some embodiments, between 50 nm and 150 nm in some embodiments, between 75 nm and 125 nm in some embodiments, or other suitable values or range of values within such ranges. Other values are also possible.

Figure 5C:
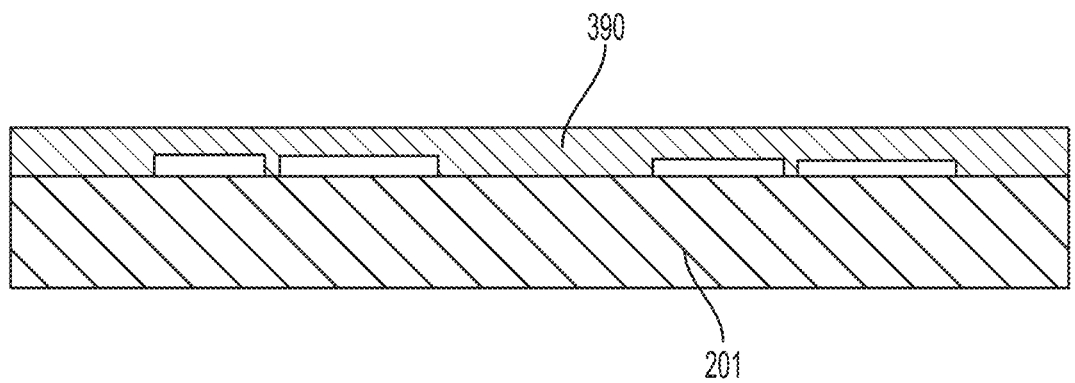

Next, as shown in FIG. 5C, a sacrificial layer 390 may be deposited on the substrate 201 or on a layer of silicon dioxide disposed on substrate 201. The sacrificial layer may comprise silicon dioxide and/or metal in some embodiments. The thickness of the sacrificial layer may be between 50 nm and 5 µm in some embodiments, between 100 nm and 1 µm in some embodiments, between 100 nm and 500 nm in some embodiments, between 200 nm and 400 nm in some embodiments, between 500 nm and 1 µm in some embodiments, between 600 nm and 800 nm in some embodiments, or any suitable value or range of values within such ranges. Other values are also possible.

Figure 5D:
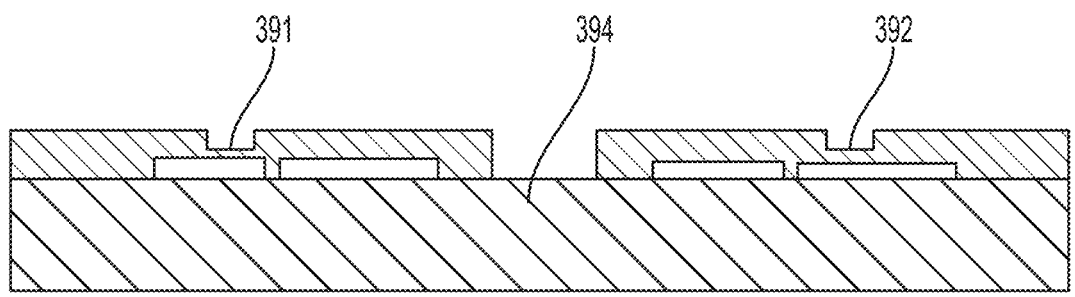

Next, as shown in FIG. 5D, sacrificial layer 390 may be patterned to form one or more openings. In some embodiments, sacrificial layer 390 may be fully etched in a region 394 corresponding to the region where anchor 340 may subsequently be formed. In some embodiments, sacrificial layer 390 may be partially etched in regions 391 and 392 corresponding to the outer electrodes, such as electrodes $221_1$ and $222_1$.

Figure 5E:
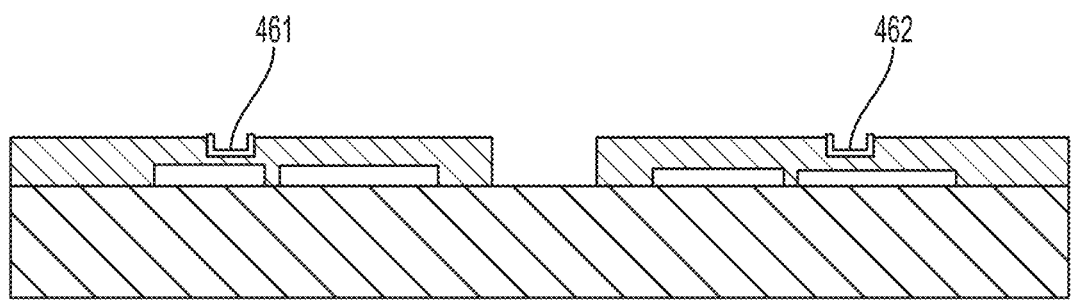

In FIG. 5E, metal may be deposited in the partially etched regions 391 and 392. In some embodiments, the metal may be deposited only on the desired regions. In other embodiments, metal may be deposited as a blanket, and the electrodes may be formed by etching the metal outside the desired regions. Such metals may correspond to electrode tips 461 and 462.

Figure 5F:
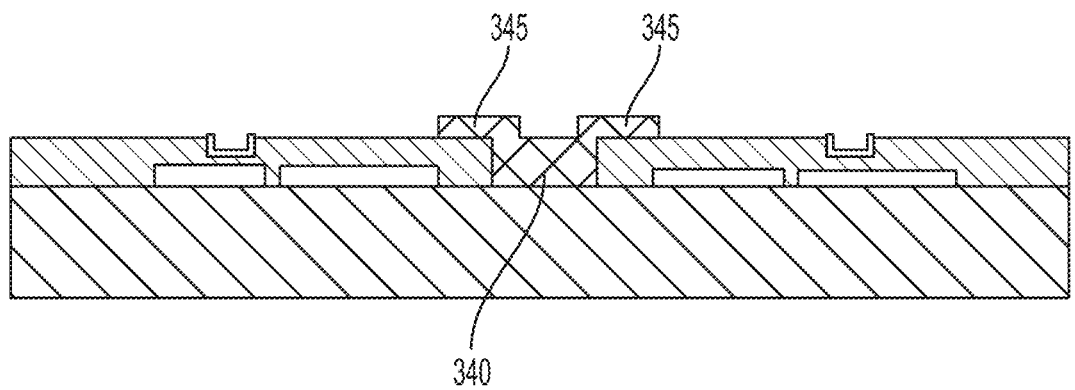

In FIG. 5F, anchor 340 and hinges 345 may be formed. In some embodiments, anchor 340 may be formed through electroplating. In some embodiments, hinges 345 may be formed through electroplating. In some embodiments, anchor 340 and hinges 345 may be formed through a single electroplating process, although an alternative embodiment provides for anchor 340 and hinges 345 to be formed through separate electroplating steps.

Figure 5G:
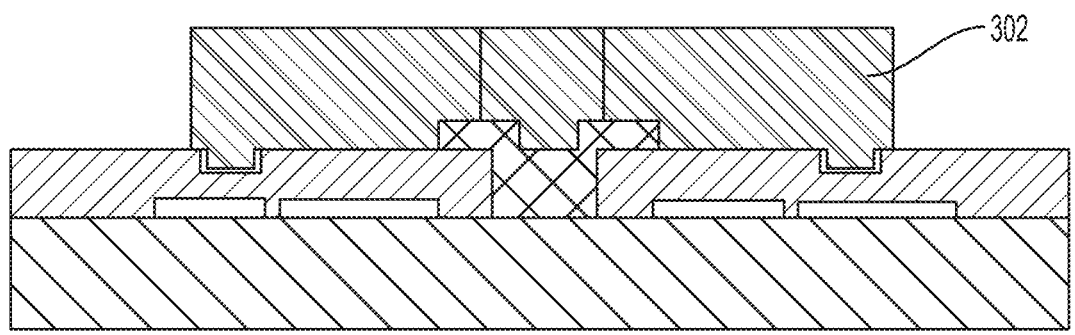

As shown in FIG. 5G, beam 302 may be formed. In some embodiments, beam 302 may be formed through electroplating. The beam 302 and hinges 345 may be formed of the same material in some embodiments, both being formed by electroplating in some instances. In other embodiments, beam 302 and hinges 345 may be formed of different materials.

Figure 5H:
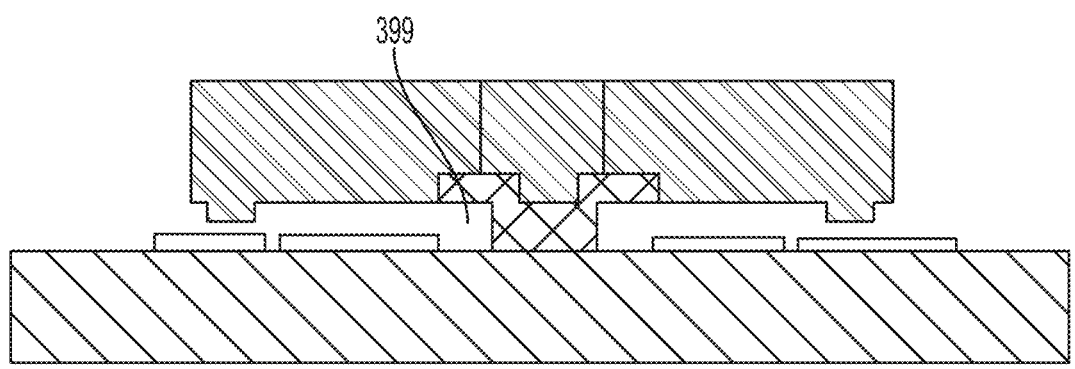

In FIG. 5H, sacrificial layer 390 may be removed to form gap 399. In some embodiments, sacrificial layer 390 may be removed through a wet etch process.

Thus, it should be appreciated that FIGS. 5A-5H illustrate a fabrication sequence for fabricating a MEMS teeter-totter switch which uses a single sacrificial layer and two electroplating steps. However, not all embodiments described herein are limited to using only a single sacrificial layer and two electroplating steps to fabricate a MEMS teeter-totter switch. MEMS teeter-totter switches according to at least some aspects of the present application may be fabricated using a different number of sacrificial layers and/or electroplating steps.

A MEMS teeter-totter switch may be used to disable/enable the electrical connection between two circuit elements. For example, in the embodiments shown in FIG. 1A and FIG. 1B the electrical path between electrode 123 and electrode 122 may be disabled/enabled depending on whether the switch is in an open or closed state. In other embodiments, a teeter-totter switch may be used to route signals to/from one of two circuit elements. In yet other embodiments, multiple teeter-totter switches may be used to perform more complex functions.

Figure 6A:
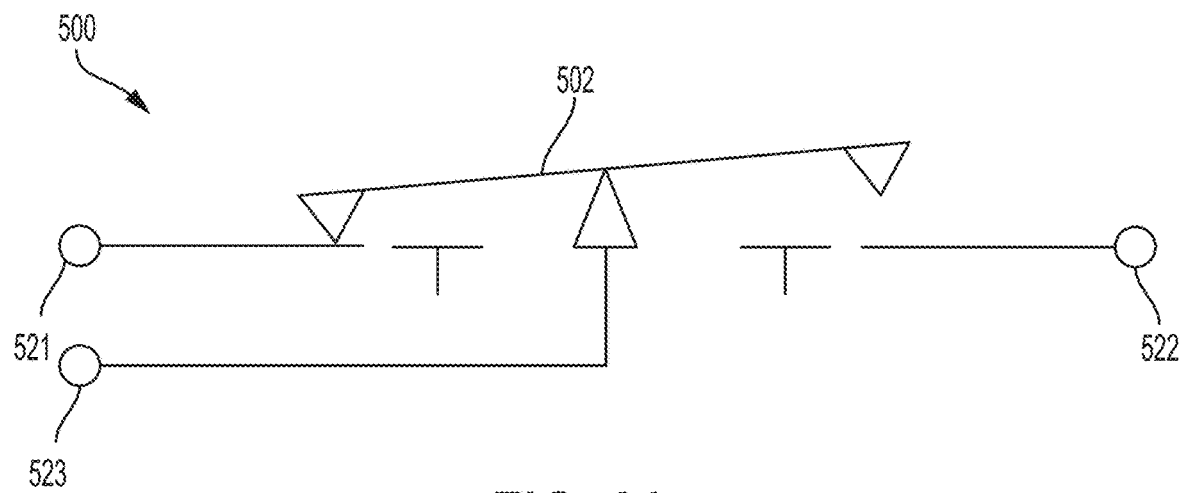
FIG. 6A illustrates schematically a teeter-totter switch having two input/output (I/O) ports, according to a non-limiting embodiment of the present application.

FIG. 6A illustrates schematically a MEMS teeter-totter switch 500 having two input/output ports, according to a non-limiting embodiment of the present application. Teeter-totter switch 500 may comprise beam 502, and electrodes 521, 522 and 523. Similarly to the embodiment of FIG. 1A, teeter-totter switch 500 may assume one among a first state, a second state and a neutral state. In the first state beam 502 may be in electrical contact with electrode 521. In such state, a signal applied to electrode 523 may be routed to a circuit element connected to electrode 521 or vice versa. In the second state, beam 502 may be in electrical contact with electrode 522. In such state, a signal applied to electrode 523 may be routed to a circuit element connected to electrode 522 or vice versa. In the neutral state, the beam is electrically floating and is not connected to any electrode.

Figure 6B:
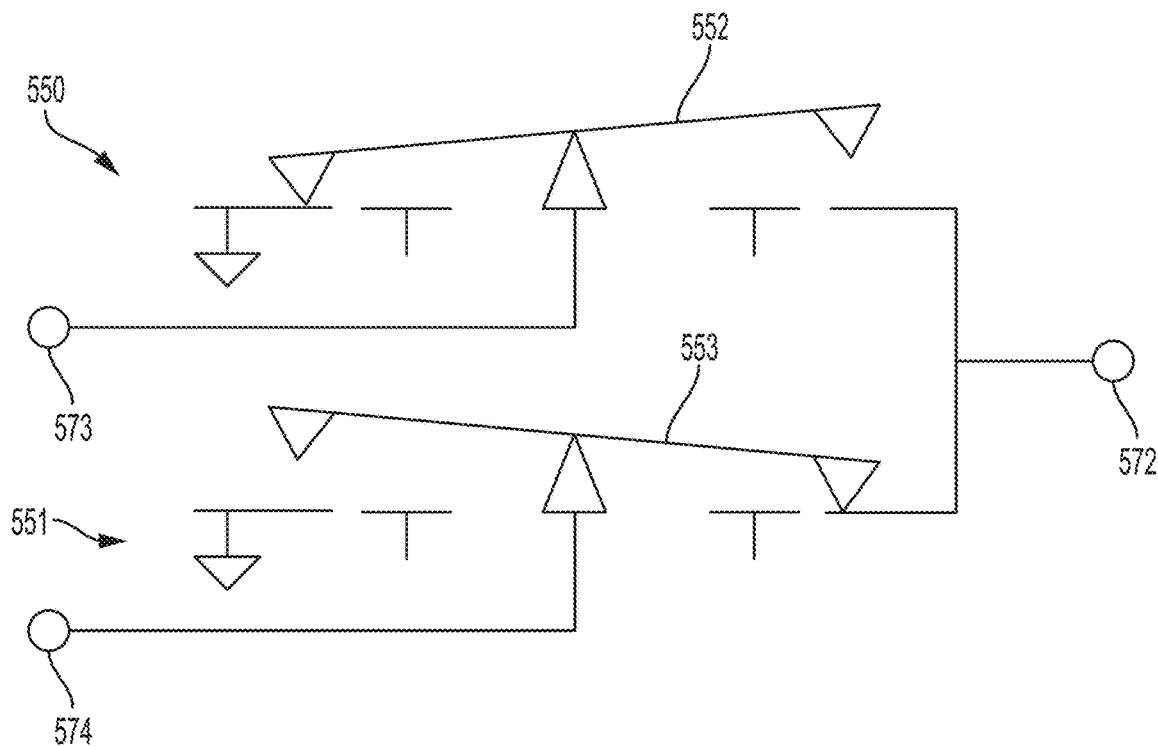
FIG. 6B illustrates schematically two teeter-totter switches having one common terminal, according to a non-limiting embodiment of the present application.

FIG. 6B illustrates schematically teeter-totter switches 550 and 551 having one common terminal, according to a non-limiting embodiment of the present application. Teeter-totter switch 550 may comprise beam 552, electrode 573 and 572, while teeter-totter switch 551 may comprise beam 553, electrode 574 and 572. Electrode 572 may be shared between teeter-totter switches 550 and 551. The system comprising the two teeter-totter switches may assume one of four possible states: (open, open), (open, closed), (closed, open) or (closed, closed). For example, FIG. 6B illustrates a case in which the system is in the (open, closed) state. In such a state, beam 552 is electrically connected to the ground terminal while beam 553 is electrically connected to electrode 572. In some embodiments, a plurality of teeter-totter switches of the type described herein may be combined to perform logic and/or arithmetic functions.

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

According to an aspect of the present application, a MEMS switch exhibiting extended lifetime compared to conventional cantilevered beam MEMS switches is provided. According to an aspect of the present application, a MEMS teeter-totter switch is provided. The teeter-totter switch of the type described herein may be actively opened and closed, thus facilitating use of a stiff beam and extending the lifetime of the switch.

According to an aspect of the present application, a highly robust MEMS switch is provided, exhibiting limited stress experienced by the beam of the switch. According to aspects of the present application a MEMS teeter-totter switch having a stiff beam and flexible hinges is provided. The hinges may be configured to flex or bend, thus facilitating the rotation of the beam while minimizing the stress experienced by the beam.

Another aspect of the present application provides a MEMS switch exhibiting improved electrical contact to the electrodes positioned on the substrate. According to aspects of the present application, a teeter-totter switch comprising, on each end of the beam, a plurality of electrodes is provided. In some instances, having more than one electrode on each end of the beam may provide robust electrical contacts.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) switch, comprising:
   a substrate;
   a post on the substrate;
   first, second, third and fourth electrodes disposed on the substrate, the first and second electrodes being positioned on a first side of the post, the third and fourth electrodes being positioned on a second side of the post that is opposite the first side;
   a fifth electrode disposed on the substrate and in electrical communication with the post;
   a microscale beam enclosing an opening in a center portion thereof, the post being disposed within the enclosed opening; and
   a hinge disposed within the enclosed opening and mechanically coupling the beam to the post,
   wherein the hinge has a first thickness and the beam comprises a conductive beam of a second thickness greater than the first thickness.

2. The MEMS switch of claim 1, wherein the conductive beam comprises first and second conductive layers.

3. The MEMS switch of claim 1, wherein the first thickness is less than half the second thickness.

4. The MEMS switch of claim 1, wherein the beam has a first end configured to make electrical contact with the substrate, a second end configured to make electrical contact with the substrate, and a length between the first end and the second end, and wherein the hinge has a length in a same direction as the length of the beam.

5. The MEMS switch of claim 1, wherein the beam has a first end configured to make electrical contact with the substrate, a second end configured to make electrical contact with the substrate, and a length between the first end and the second end, and wherein the hinge has a length in a direction perpendicular to the length of the beam.

6. The MEMS switch of claim 1, wherein the conductive beam and the hinge are formed of a same material.

7. The MEMS switch of claim 1, wherein:
the first electrode forms a first capacitor with the conductive beam, and the third electrode forms a second capacitor with the conductive beam, wherein the first and second capacitors are arranged for controlling orientation of the conductive beam,
the second electrode is positioned to contact a first portion of the conductive beam when the conductive beam is in a first orientation, wherein the second electrode forms part of a first conductive path comprising the first portion of the conductive beam, the post, and the fifth electrode when the conductive beam is in the first orientation, and
the fourth electrode is positioned to contact a second portion of the conductive beam when the conductive beam is in a second orientation different from the first orientation, wherein the fourth electrode forms part of a second conductive path comprising the second portion of the conductive beam, the post, and the fifth electrode when the conductive beam is in the second orientation.

8. A method of fabricating a microelectromechanical systems (MEMS) switch, comprising:
fabricating a post on a substrate;
fabricating a hinge coupled to the post;
fabricating first, second, third and fourth electrodes on the substrate, such that the first and second electrodes are positioned on a first side of the post and the third and fourth electrodes are positioned on a second side of the post that is opposite the first side;
fabricating a fifth electrode on the substrate and in electrical communication with the post; and
fabricating a beam enclosing an opening in a center portion thereof,
each of the post and the hinge being disposed within the enclosed opening, and the beam being coupled to the post via the hinge,
wherein fabricating the hinge and fabricating the beam comprises fabricating the hinge to have a first thickness and the beam to have a second thickness greater than the first thickness.

9. The method of claim 8, wherein fabricating the hinge and fabricating the beam comprises fabricating the hinge to have the first thickness less than half the second thickness.

10. The method of claim 8, wherein fabricating the hinge and fabricating the beam comprises fabricating a length of the hinge to be in a same direction as a length of the beam.

11. The method of claim 8, wherein fabricating the hinge and fabricating the beam comprises fabricating a length of the hinge to be substantially perpendicular to a length of the beam.

12. The method of claim 8, wherein fabricating the hinge and fabricating the beam comprises fabricating the hinge and the beam of a same material.

13. The method of claim 8, wherein fabricating the post, the hinge, and the beam involves performing fewer than three electroplating steps.

14. The method of claim 8, wherein fabricating the fifth electrode and fabricating the post comprise fabricating the fifth electrode to be between the post and the substrate.

15. A microelectromechanical systems (MEMS) switch, comprising:
a substrate;
a post on the substrate;
first, second, third and fourth electrodes disposed on the substrate, the first and second electrodes being positioned on a first side of the post, the third and fourth electrodes being positioned on a second side of the post that is opposite the first side;
a fifth electrode disposed on the substrate and in electrical communication with the post;
a microscale beam enclosing an opening in a center portion thereof, the post being disposed within the enclosed opening; and
means for coupling the beam to the post,
wherein the means has a first thickness and the beam comprises a conductive beam of a second thickness greater than the first thickness.

16. The MEMS switch of claim 15, wherein the conductive beam comprises first and second conductive layers.

17. The MEMS switch of claim 15, wherein the means is disposed within the enclosed opening.

18. The MEMS switch of claim 15, wherein the beam has a first end configured to make electrical contact with the substrate, a second end configured to make electrical contact with the substrate, and a length between the first end and the second end, and wherein the means has a length in a same direction as the length of the beam.

19. The MEMS switch of claim 15, wherein the beam has a first end configured to make electrical contact with the substrate, a second end configured to make electrical contact with the substrate, and a length between the first end and the second end, and wherein the means has a length in a direction perpendicular to the length of the beam.

20. The MEMS switch of claim 15, wherein:
the first electrode forms a first capacitor with the conductive beam, and the third electrode forms a second capacitor with the conductive beam, wherein the first and second capacitors are arranged for controlling orientation of the conductive beam,
the second electrode is positioned to contact a first portion of the conductive beam when the conductive beam is in a first orientation, wherein the second electrode forms part of a first conductive path comprising the first portion of the conductive beam, the post, and the fifth electrode when the conductive beam is in the first orientation, and
the fourth electrode is positioned to contact a second portion of the conductive beam when the conductive beam is in a second orientation different from the first orientation, wherein the fourth electrode forms part of a second conductive path comprising the second portion of the conductive beam, the post, and the fifth electrode when the conductive beam is in the second orientation.

* * * * *